(12) United States Patent
Tyni et al.

(10) Patent No.: US 7,708,118 B2
(45) Date of Patent: May 4, 2010

(54) CONDITION MONITORING METHOD

(75) Inventors: Tapio Tyni, Hyvinkää (FI); Pekka Perälä, Kerava (FI)

(73) Assignee: Kone Corporation, Helsinki (FI)

( * ) Notice: Subject to any disclaimer, the term of this patent is extended or adjusted under 35 U.S.C. 154(b) by 0 days.

(21) Appl. No.: 12/465,221

(22) Filed: May 13, 2009

(65) Prior Publication Data
US 2009/0218176 A1 Sep. 3, 2009

Related U.S. Application Data

(63) Continuation of application No. PCT/FI2007/000284, filed on Dec. 5, 2007.

(30) Foreign Application Priority Data

Dec. 8, 2006 (FI) ................................. 20061090

(51) Int. Cl.
*B66B 1/34* (2006.01)
(52) U.S. Cl. ....................................................... 187/391
(58) Field of Classification Search ................. 187/247, 187/391–394; 49/26, 28, 120
See application file for complete search history.

(56) References Cited

U.S. PATENT DOCUMENTS

| 3,854,554 | A | * | 12/1974 | Booker, Jr. ................... 187/382 |
| 5,787,020 | A | * | 7/1998 | Molliere et al. ............. 702/183 |
| 6,193,019 | B1 | * | 2/2001 | Sirigu et al. ................ 187/391 |
| 6,591,947 | B2 | * | 7/2003 | Horbrugger et al. ......... 187/393 |
| 7,097,003 | B2 | * | 8/2006 | Reynolds et al. ............ 187/351 |
| 7,350,624 | B2 | * | 4/2008 | Deplazes et al. ............ 187/393 |
| 7,503,435 | B2 | * | 3/2009 | Tyni et al. ................... 187/391 |

FOREIGN PATENT DOCUMENTS

WO  WO-2006/106172 A1  10/2006

* cited by examiner

*Primary Examiner*—Jonathan Salata
(74) *Attorney, Agent, or Firm*—Birch, Stewart, Koalsch & Birch, LLP

(57) ABSTRACT

Method for the condition monitoring of the safety switches of the safety circuit of an elevator. Inferences can be made about the condition of a safety switch by measuring and examining the current of the safety circuit of the elevator after the state of the safety circuit has changed. The current signal is filtered, after which the amount of interference caused by contact malfunctions of the switch is determined from it. Based on the amount of interference it is possible to determine in what condition the switch is.

20 Claims, 5 Drawing Sheets

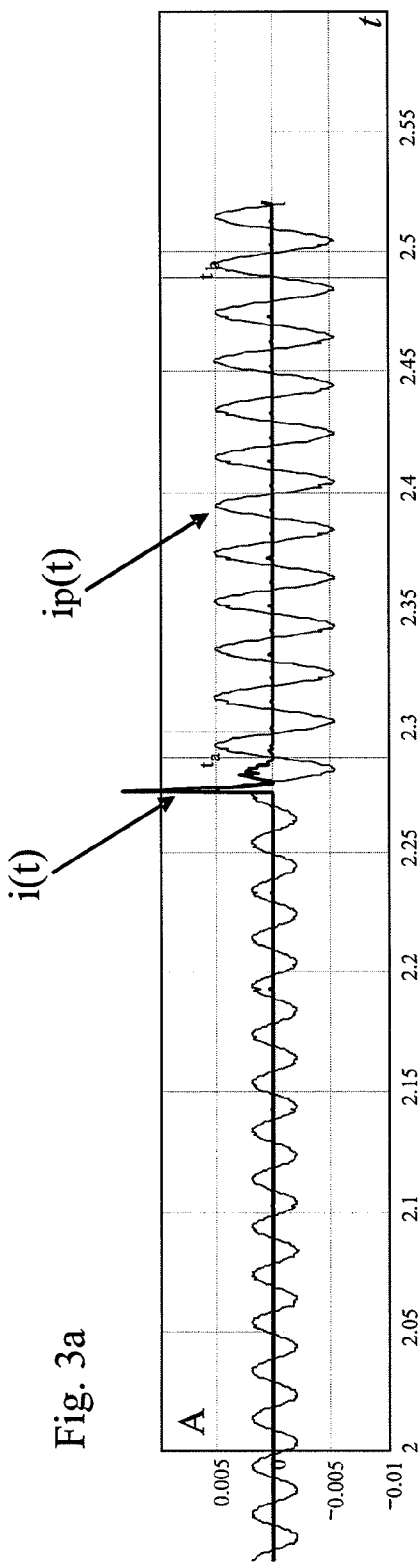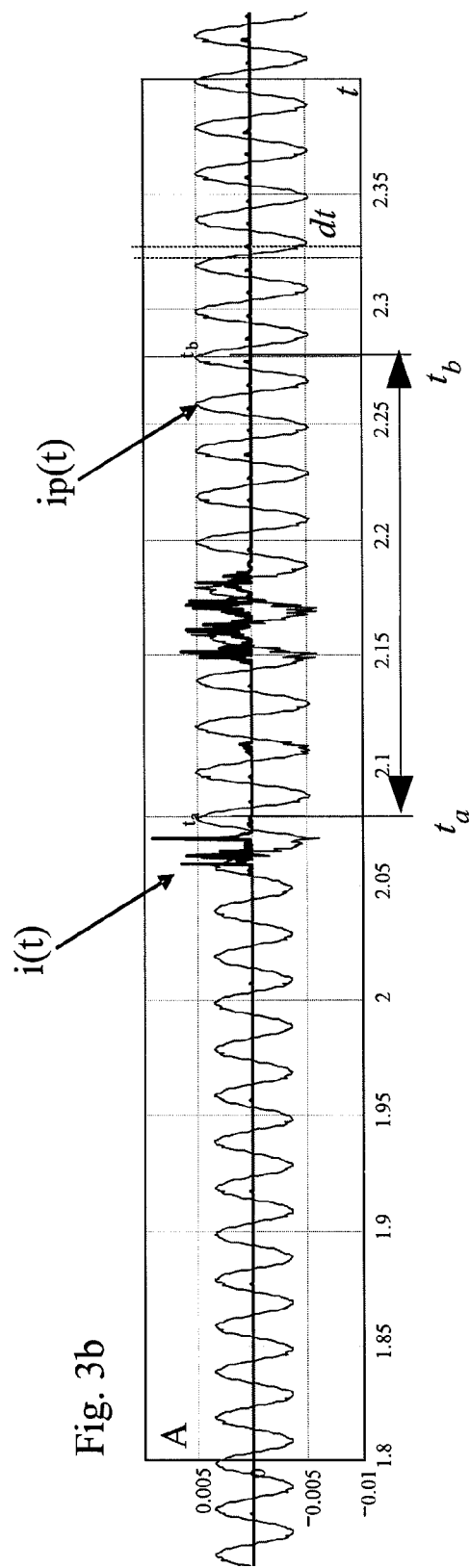

CONDITION MONITORING METHOD

Figure 1:
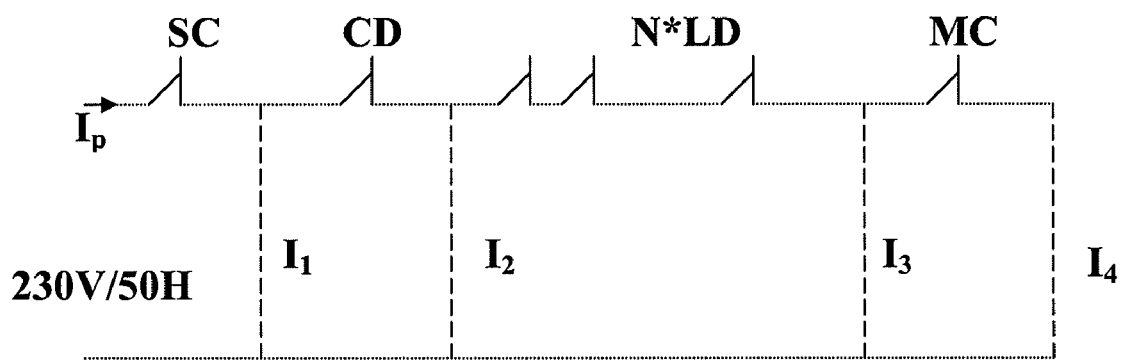

This application is a Continuation of copending PCT International Application No. PCT/FI2007/000284 filed on Dec. 5, 2007, which designated the United States, and on which priority is claimed under 35 U.S.C. §120. This application also claims priority under 35 U.S.C. §119(a) on Patent Application No(s). 20061090 filed in Finland on Dec. 8, 2006, the entire contents of each of the above documents is hereby incorporated by reference into the present application.

FIELD OF THE INVENTION

The present invention relates to elevator systems. More particularly the present invention relates to a method and a system for monitoring the condition of the safety switches of the safety circuit of an elevator.

BACKGROUND OF THE INVENTION

It is of primary importance for the operation of an elevator system that the elevator system operates faultlessly and above all safely. For this reason numerous different safety devices are in use in elevator systems. One of these is the so-called safety circuit. A safety circuit, which travels from one safety device of the elevator to another, is the most important part of the electrical safety system of an elevator. The circuit comprises chained contacts and switches such as the switches of a static circuit, the switches of the car and landing door, the switches of locks and the contactor of the elevator. If even one safety device disconnects the safety circuit, the elevator stops or it will not start moving. If e.g. the doors of the elevator car are open, the safety circuit is open and the elevator will not start moving before the doors are closed and the safety circuit in its entirety is closed.

An elevator that is already in use must be serviced and its condition checked under legal requirements to ensure its safe operation. In the inspection of the condition of the elevator operating tests are performed on it, i.e. the functioning of the safety devices and alarm devices are tested and it is checked that the elevator will not move before the car and landing doors are closed, and that they will not open before the elevator is at a floor. The safety circuit and its contacts and switches thus have an important role in the condition monitoring of the elevator. When inspecting the condition of an elevator different condition monitoring appliances can be used, the analyzers of which can utilize information about the current traveling in the safety circuit.

Inferences can thus be made about the condition of the elevator by examining the operation of the safety circuit of the elevator and its safety switches. On the basis of the strength of the current traveling in different points of the safety circuit it can be inferred which switches that belong to the safety circuit are open or closed at each moment in time, and whether the switches of the safety circuit operate according to the regulations set for them.

Depending on the states of the contacts of the safety circuit, i.e. whether each switch is open or closed, the current traveling in the safety circuit receives different levels of strength. During the start-up of the elevator samples are received of all the current levels of the safety circuit, which are classified. As a result of this a class center of current strength corresponding to each state of the safety circuit is ascertained. After start-up, during normal operation of the elevator, the state of the safety circuit can be determined by means of the current measured from the safety circuit, e.g. by seeking the class center most closely corresponding to the strength of the measured current.

The switches in the dynamic part of the safety circuit change their state all the time during normal operation of the elevator, in which case they wear and do not necessarily connect properly. Also dirt, grease, etc., that enters the switches may cause contact malfunctions. If even one of the contacts of a safety circuit does not connect, the elevator is not able to move or, if the elevator is moving, it stops. Finding a defective switch is awkward because all the switches are in series and they are situated on different sides of the elevator shaft far apart from each other. The malfunctioning may also be concealed, in which case one of the switches causes random switching interference.

Bad contacts of the switches can be indirectly monitored e.g. via failed starts or by re-openings of a fully-closed door. The use of monitoring of re-openings of the doors in determining contact malfunctions is based on the fact that the control system endeavors to make the safety circuit unbroken by re-opening a door. A traditionally awkward situation from the standpoint of the serviceman is if the elevator has stopped between floors in the middle of a run. If the source of the problem is the contacts of the door or of the lock of a landing, and there is no remote monitoring in the elevator, locating the fault can be awkward. In this case it is possible that the elevator starts to run e.g. after a restart (reset), in which case the fault remains concealed and causes a new fault situation after some time has passed. The location of the switches may also be awkward to access, in addition to which the switches are located in the elevator shaft a considerable distance from each other, especially in a high-rise building.

Thus by means of also modern remote monitoring it is possible to indirectly monitor contact malfunctions via re-openings and attempted starts. In this case, however, contact malfunction has progressed very far and they cause fault situations. In addition, re-openings and failed starts erode the transportation capacity of the elevator and impair ride comfort.

PURPOSE OF THE INVENTION

The purpose of the present invention is to disclose a method and a system for monitoring the condition of the safety switches of the safety circuit of an elevator.

SUMMARY OF THE INVENTION

The method, the system and the software product according to the invention are characterized by what is disclosed in the characterization part of claim 1, 7 and 13. Other embodiments of the invention are characterized by what is disclosed in the other claims. Some inventive embodiments are also presented in the drawings in the descriptive section of the present application. The inventive content of the application can also be defined differently than in the claims presented below. The inventive content may also consist of several separate inventions, especially if the invention is considered in the light of expressions or implicit sub-tasks or from the point of view of advantages or categories of advantages achieved. In this case, some of the attributes contained in the claims below may be superfluous from the point of view of separate inventive concepts. The features of the various embodiments can be applied within the scope of the basic inventive concept in conjunction with other embodiments.

The object of the invention is a method for monitoring the condition of the safety switches of a safety circuit of an elevator, in which method the strength of the current traveling in the safety circuit is measured, the state of the safety circuit is determined on the basis of the measured current and the amount of interference caused by contact malfunctions of the switches is determined as well as the condition of the safety switches on the basis of the state of the safety circuit.

According to the method of the invention the current signal of the safety circuit is filtered, after which the amount of interference of the safety switch is determined from the filtered current signal. The current signal is filtered preferably through a band-elimination filter. The condition of the safety switch is determined on the basis of the amount of interference received from the filtered current signal.

The object of the invention is also a system for the condition monitoring of the safety switches of the safety circuit of an elevator. The system comprises the safety circuit of an elevator, which comprises safety switches and safety contacts connected in series. Additionally, the system comprises measuring means for measuring the current traveling in the safety circuit, means for determining the state of the safety circuit on the basis of the measured current, means for filtering the current signal of the safety circuit and means for determining the amount of interference from the filtered current signal. The system further comprises means for determining the condition of a safety switch on the basis of the amount of interference and the state of the safety circuit.

The object of the invention is also a software product for monitoring the condition of the safety switches of the safety circuit of an elevator in the system, which system comprises a safety circuit of an elevator comprising safety switches connected in series as well as measuring means for measuring the current traveling in the safety circuit. The software product comprises code, which is fitted to perform the method phases presented in the method claims, when they are run in a data processing appliance.

In one embodiment of the invention the times of the change of state of the safety circuit are determined from the current signal of the safety circuit and the amount of interference is determined from the filtered current signal directly after the change of state of the safety circuit. The term "directly" in this context means that the amount of interference is calculated immediately after the identified time of the change of state or after the desired delay following the change of state.

According to one embodiment of the invention the amount of interference is determined from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

According to one preferred embodiment of the invention the average interference over a certain time span is determined for each state of the safety circuit and/or for each floor of the building.

According to one embodiment of the invention a histogram of interference is determined for each state of the safety circuit and/or for each floor of the building.

The purpose of the invention is to monitor the condition of the safety switches of the safety circuit, so that worn safety switches can be detected before a bad contact causes disconnection of the safety circuit and a fault situation. The invention can also be utilized in modern condition monitoring analyzers, which measure the current of the safety circuit and determine from it the state of the safety circuit and the time of the change of state. It is easy to add a function to these kinds of condition monitoring analyzers, which monitors the condition of the contacts and detects problems starting in them before a conventional condition monitoring system is able to detect them via re-openings and failed starts. In this way the monitoring of the condition of an elevator can be facilitated and safe functioning of the elevator can be ensured.

The present invention has numerous advantages compared to prior art solutions. As a result of the invention the condition of the switches of the safety circuit are continuously monitored, in which case a potential problem can be prevented in advance in conjunction with a normal service visit, long before it escalates into a fault situation that halts the elevator. Worn switches and contacts can be serviced/adjusted/replaced before they actually impair the properties of the elevator. As a result of the invention it is possible to locate any of the switches of the safety circuit that require servicing actions, in which case the performance of servicing actions is speeded up and unnecessary troubleshooting is avoided.

LIST OF FIGURES

Figure 2A:
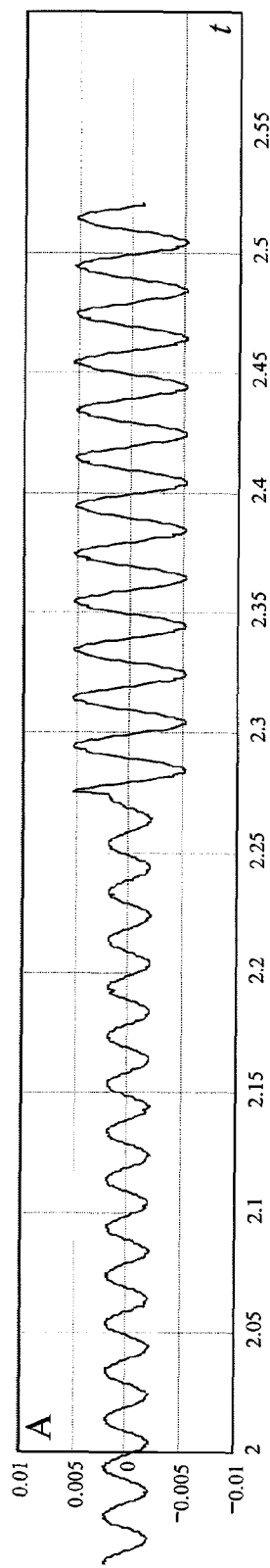
Figure 2B:
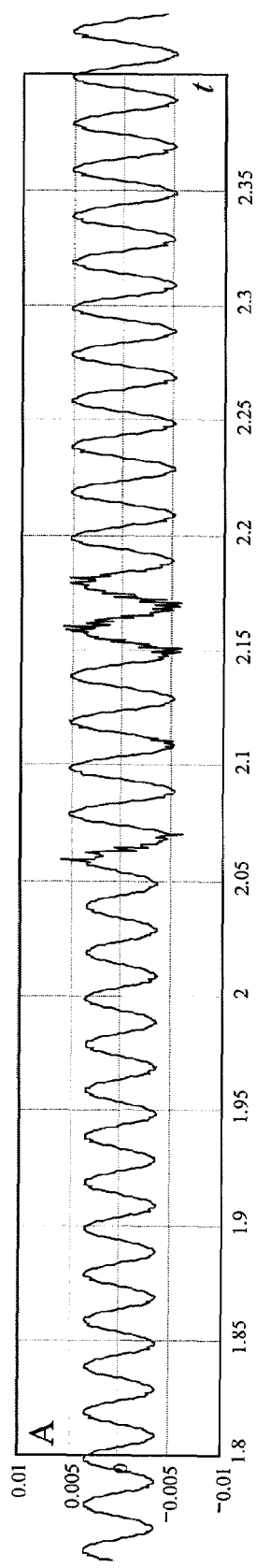
Figure 4:
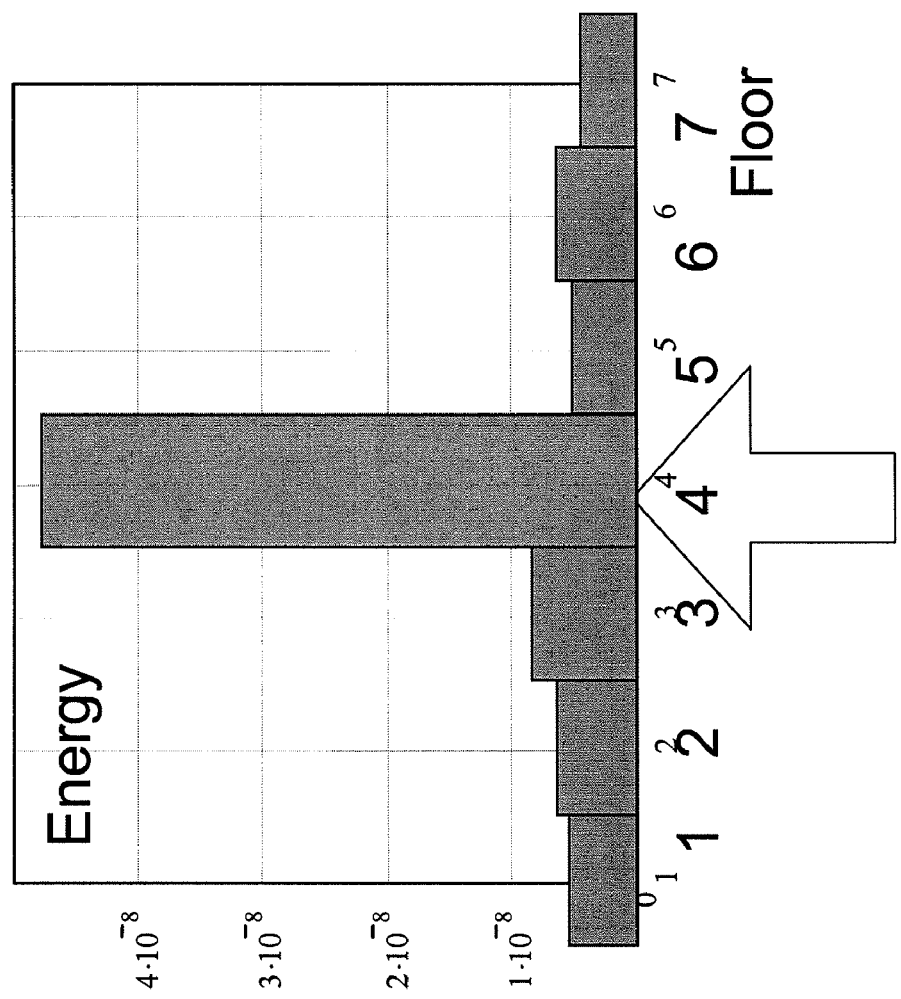
Figure 5:
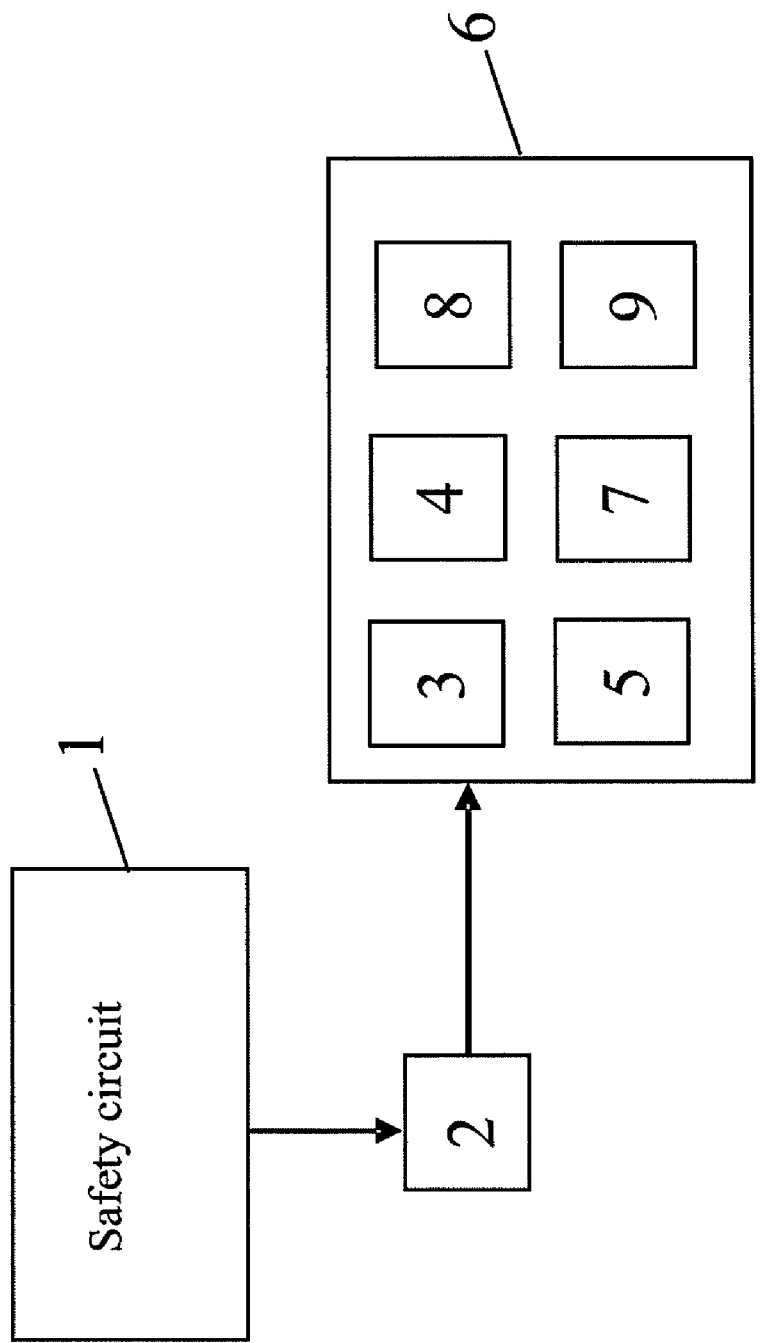

In the following, the invention will be described in detail by the aid of a few examples of its embodiments, wherein:

FIG. 1 presents the safety circuit of an elevator and the current traveling in it as well as the safety switches of the safety circuit, FIG. 2a presents the current traveling in the safety circuit when the relevant switch of the safety circuit is in good condition, FIG. 2b presents the current of the safety circuit when the relevant safety switch has worn, FIG. 3a presents the current signal of the safety circuit and the filtered current signal when the relevant switch of the safety circuit is in good condition, FIG. 3b presents the current signal of the safety circuit and the filtered current signal when the relevant safety switch has worn, FIG. 4 presents by means of a histogram the cumulative energy of the noise/interference of a switch that has accumulated during a certain time span, and FIG. 5 presents by means of a block diagram one embodiment of a system according to the present invention.

DETAILED DESCRIPTION OF THE INVENTION

In the following, the invention will be described in detail with reference to the FIGS. 1-5.

During the start-up of the elevator samples are received of all the current levels of the safety circuit. From the measured current the state of the safety circuit be inferred, and the moments in time of changes in state of the safety circuit, i.e. those moments in time when the switches of the safety circuit change their state.

FIG. 1 presents one embodiment of a safety circuit, in which the currents $i_1$, $i_2$, $i_3$ and $i_4$ are marked in different parts of the drawing. The SC in the safety circuit presented in FIG. 1 describes the static circuit of the safety circuit. The switch CD presents the switch of the door of the car and the switches N*LD the switches of the doors of the landing. The number of levels is N, depending on how many floors there are in the elevator. The switch MC corresponds to the main contactor. The currents $i_1$, $i_2$, $i_3$ and $i_4$ present the galvanically isolated components in the safety circuit, such as the control currents of relays or opto-isolators for controlling the safety devices of the elevator and/or for indicating the state of the safety circuit.

The total current $i_p$ at point p is obtained as follows:

$$i_p = SC \cdot i_1 \left\{ 1 + CD \cdot i_2 \left[ 1 + \prod_{k=1}^{N} LD_k \cdot i_3 (1 + MC \cdot i_4) \right] \right\}$$

in which the switches SC, CD, LD and MC receive the value 0 or 1.

Inferences about the state of the safety circuit at any time can be made from the magnitude of the total current. The possible states of the safety circuit are defined in Table 1 below.

TABLE 1

| Current of safety circuit at point p | State of switches | Operational status of safety circuit |
| --- | --- | --- |
| i = 0 | SC = 0 | static circuit is open |
| i = i1 | SC = 1, CD = 0 | static circuit is closed |
| i = i1 + i2 | SC = 1, CD = 1, $\prod$ LD = 0 | static circuit and door of car are closed |
| i = i1 + i2 + i3 | SC = 1, CD = 1, $\prod$ LD = 1, MC = 0 | static circuit, doors of car and landing are closed |
| i = i1 + i2 + i3 + i4 | SC = 1, CD = 1, $\prod$ LD = 1, MC = 1 | safety circuit is closed and main contactor energized (elevator moves) |

The safety circuit of the example can thus receive five different states, which can be distinguished from each other on the basis of the magnitude of the current traveling in the point p. A switch situated physically earlier in the safety circuit chain masks information about the state of switches situated later in the chain. This is not however a serious deficiency because what is important to know is which part of the safety circuit prevents the starting of the elevator. It is obvious to the person skilled in the art that the safety circuit can also be formed from safety switches connected in series in a manner that differs from that of FIG. 1, in which case the number of identifiable states can also differ from the example presented above.

If the switches of the safety circuit are in good condition, the current signal measured from the safety circuit looks like the signal of FIG. 2a. Normally the safety circuit is supplied from the electricity network, in which case the current signal is actually a 50 Hz carrier wave (60 Hz in North America) amplitude-modulated by the state of the switches of the safety circuit. In the example the state of the safety circuit changes at the point t=2.27, which can be observed from the change in amplitude of the current signal. In the case of FIG. 2b the safety switch is worn or defective, in which case it causes interference in the current signal of the safety circuit but which does not yet produce re-openings or failed starts. In other words, at the point t=2.05 the safety circuit changes state (the amplitude of the current signal changes) and the worn/defective switch causes noise in the current signal at the point t=2.15. Since it is known in connection with which change of state there is interference in the current signal, the part of the safety circuit with problems in the switches is also known.

FIGS. 3a and 3b present the measured current signal $i_p(t)$ of the safety circuit as well as the current signal i(t) run through the band-elimination filter. The purpose of the band-elimination filter is to eliminate the carrier wave itself from the current signal and to leave behind any frequency components that do not belong to the carrier wave. The current signal of FIG. 3a is the current signal of a safety switch that is in good condition. From the filtered current signal i(t) of FIG. 3b the harmonic components of the carrier wave (50/60 Hz) can be observed as well as the switching interference of the contacts, which represent high frequencies with respect to the 50 Hz frequency of the carrier wave. These appear immediately after the safety circuit has changed state. In other words inferences can be made about the condition of a contact of the safety circuit by monitoring the behavior of the filtered current signal i(t) in the time interval ($t_a$-$t_b$) directly after a change of state of the safety circuit.

The condition of a safety switch thus affects the amount of noise in the filtered current signal directly after a change of state of the safety circuit. The amount of noise or interference caused by a worn switch can be determined e.g. by measuring the "energy" of higher frequency interference resulting from a bad contact just after the change of state by means of the equation (1):

$$E(t_a, t_b) = \int_{t_a}^{t_b} i(t)^2 \, dt, \quad (1)$$

in which i(t) is the filtered current signal and $E(t_a, t_b)$ describes the amount of interference 1. in its "energy" period $t_a$-$t_b$.

Statistics of the interference energies can be compiled, e.g. by calculating for each floor the average interference energy during 24 hours for the state and change of state of each door, floor or safety circuit, which is thus the average interference power. A second, more detailed method for compiling and recording statistics is a histogram of the interference energies, which is presented in FIG. 4. In the figure a badly functioning door contact has been on floor 4, in which the interference energy is approx. tenfold that of the other floors. From this it can be inferred that the door/lock contacts of floor 4 are in bad condition and they must be serviced/adjusted/replaced. If the switching energy increases evenly on all floors, it can be inferred that the source of the problem is the lock contact or door contact of the car. Also the state definition of the safety circuit can be utilized by determining the interference energies directly after each change of state.

FIG. 5 presents a block diagram serving as an example of the system according to the invention, which comprises the safety circuit 1 of an elevator. The safety circuit comprises safety switches and safety contacts connected in series (not shown in FIG. 5), the condition of which is examined by means of the condition monitoring appliances 6. The system comprises measuring means 2 for measuring the current of the safety circuit. The current of the safety circuit is measured preferably without loading the electrical safety circuit, i.e. without taking energy from the safety circuit. The measuring means preferably comprise a current sensor that measures the strength of the magnetic field produced by the current. The system also comprises means 3 for filtering the current signal of the safety circuit and means 4 for determining from the filtered current signal the amount of noise or interference caused by a worn switch. The system further comprises means 7 for determining the state and the moment of the change of state of the safety circuit and means 5 for determining the condition of a safety switch on the basis of the amount of interference. The system further comprises means 9 for determining a histogram of interference for each state of the safety circuit and/or for each floor of the building and means 8 for determining the average interference over a certain time span for each state of the safety circuit and/or for each floor of the building.

It should further be noted that the block diagram presented above is a basic example of the system according to the invention. That being the case the system may of course also incorporate other components and functional blocks than those presented above. The system may comprise, for example, an interface, via which the condition monitoring data formed by the system can be conveyed to other systems, such as e.g. to a remote servicing system, to the control system of an elevator and/or of an elevator group or to any other similar separate system whatsoever. The system can also be integrated either fully or partially into some existing system that is in connection with the elevator system, such as e.g. the condition monitoring system of an elevator and/or the control system of an elevator. Likewise the system may receive information via the interface about the elevator system, e.g. information about the floor at which the elevator is at the time.

The invention is not limited solely to the embodiments described above, but instead many variations are possible within the scope of the inventive concept defined by the claims below.

The invention claimed is:

1. A method for monitoring the condition of at least one safety switch of a safety circuit of an elevator, the safety circuit comprising safety switches connected in series, said method comprising the steps of:
   measuring a current signal traveling in the safety circuit;
   determining a state of the safety circuit from the current signal of the safety circuit;
   filtering the current signal of the safety circuit;
   determining an amount of interference from the filtered current signal; and
   determining the condition of the at least one safety switch on the basis of the amount of interference and the state of the safety circuit.

2. The method according to claim 1, further comprising the steps of:
   determining times of the change of state of the safety circuit from the current signal of the safety circuit; and
   determining the amount of interference from the filtered current signal directly after the change of state of the safety circuit.

3. The method according to claim 1, further comprising the step of filtering the current signal with a band-elimination filter.

4. The method according to claim 1, further comprising the step of determining the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

5. The method according to claim 1, further comprising the step of determining an average interference over a certain time span for each state of the safety circuit and/or for each floor of the building.

6. The method according to claim 5, further comprising the step of determining a histogram of interference for each state of the safety circuit and/or for each floor of the building.

7. A system for monitoring the condition of at least on safety switch of a safety circuit of an elevator, comprising:
   a safety circuit comprising safety switches connected in series;
   a measuring device that measures a current signal traveling in the safety circuit;
   a device that determines a state of the safety circuit on the basis of the measured current signal;
   a device that filters the current signal of the safety circuit;
   a device that determines an amount of interference from the filtered current signal; and
   a device that determines the condition of the at least one safety switch on the basis of the amount of interference and the state of the safety circuit.

8. The system according to claim 7, wherein the system further comprises:
   a device that determines times of the change of state of the safety circuit from the current signal of the safety circuit, the device that determines times being arranged to determine the amount of interference from the filtered current signal directly after the change of state of the safety circuit.

9. The system according to claim 7, wherein the device that filters the current signal of the safety circuit comprise a band-elimination filter.

10. The system according to claim 7, wherein the device that determines interference is arranged to determine the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

11. The system according to claim 7, wherein the system further comprises:
   a device that determines an average interference over a certain time span for each state of the safety circuit and/or for each floor of the building.

12. The system according to above claim 7, wherein the system further comprises:
   a device that determines a histogram of interference for each state of the safety circuit and/or for each floor of the building.

13. A software product embodied on a computer readable medium for monitoring the condition of at least one safety switch of a safety circuit of an elevator in system, the system comprising:
   a safety circuit comprising safety switches connected in series;
   a measuring device that measures a current signal traveling in the safety circuit, wherein the software product comprises code, configured to perform the method according to claim 1, when run in a data processing appliance.

14. The software product according to claim 13, wherein the software product is configured to perform the steps of:
   determining times of the change of state of the safety circuit from the current signal of the safety circuit; and determining the amount of interference from the filtered current signal directly after the change of state of the safety circuit.

15. The method according to claim 2, further comprising the step of filtering the current signal with a band-elimination filter.

16. The method according to claim 2, further comprising the step of determining the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

17. The method according to claim 3, further comprising the step of determining the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

18. The system according to claim 8, wherein the device that filters the current signal of the safety circuit comprise a band-elimination filter.

19. System according to claim 8, wherein the device that determines interference is arranged to determine the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

20. System according to claim 9, wherein the device that determines interference is arranged to determine the amount of interference from the filtered current signal according to the following equation:

$$E(t_a, t_b) = \int_{t_a}^{t_b} i(t)^2 \, dt,$$

in which i(t) is the filtered current signal of the safety circuit and the time interval $t_a$-$t_b$ directly follows the time of the change of state of the safety circuit.

* * * * *